United States Patent
Cottet et al.

(10) Patent No.: US 9,899,283 B2
(45) Date of Patent: Feb. 20, 2018

(54) POWER MODULE WITH LOW STRAY INDUCTANCE

(71) Applicants: ABB Schweiz AG, Baden (CH); Audi AG, Ingolstadt (DE)

(72) Inventors: Didier Cottet, Zürich (CH); Felix Traub, Rheinfelden (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/599,626

(22) Filed: May 19, 2017

(65) Prior Publication Data

US 2017/0338162 A1    Nov. 23, 2017

(30) Foreign Application Priority Data

May 19, 2016 (EP) .................................... 16170452

(51) Int. Cl.
*H01L 23/52*    (2006.01)
*H01L 23/14*    (2006.01)
(Continued)

(52) U.S. Cl.
CPC ............ *H01L 23/142* (2013.01); *H01L 23/24* (2013.01); *H01L 24/06* (2013.01); *H01L 24/48* (2013.01);
(Continued)

(58) Field of Classification Search
CPC .......... H01L 23/50; H01L 2924/30107; H01L 25/072; H01L 2224/48111; H01L 231/5389
(Continued)

(56) References Cited

U.S. PATENT DOCUMENTS 5,705,848 A    1/1998 Bayerer
6,212,087 B1    4/2001 Grant et al.
(Continued)

FOREIGN PATENT DOCUMENTS

DE    102014102018 B3    2/2015

OTHER PUBLICATIONS

European Patent Office, Extended Search Report issued in corresponding Application No. 16170452.3, dated Nov. 14, 2016, 5 pp.

*Primary Examiner* — S. V. Clark
(74) *Attorney, Agent, or Firm* — Taft Stettinius & Hollister LLP

(57) ABSTRACT

A power module providing a half bridge comprises at least one substrate and an inner metallization area, two intermediate metallization areas and two outer metallization areas, each of which extends in a longitudinal direction of the at least one substrate; wherein the two intermediate metallization areas are arranged besides the inner metallization area with respect to a cross direction of the at least one substrate and each outer metallization area is arranged beside one of the two intermediate metallization areas with respect to the cross direction; wherein the power module comprises two inner sets of semiconductor switches, each inner set of semiconductor switches bonded to an intermediate metallization area and electrically connected to the inner metallization area, such that the inner sets of semiconductor switches form a first arm of the half bridge; wherein the power module comprises two outer sets of semiconductor switches, each outer set of semiconductor switches bonded to an outer metallization area and electrically connected to an intermediate metallization area, such that the outer sets of semiconductor switches form a second arm of the half bridge.

20 Claims, 8 Drawing Sheets

(51) Int. Cl.
*H01L 23/24* (2006.01)
*H01L 23/00* (2006.01)

(52) U.S. Cl.
CPC ............... *H01L 2924/1304* (2013.01); *H01L 2924/30107* (2013.01)

(58) Field of Classification Search
USPC .............................................. 257/678, 691
See application file for complete search history.

(56) References Cited

U.S. PATENT DOCUMENTS

| | | | |
|---|---|---|---|
| 9,591,755 B2 | 3/2017 | Spang et al. | |
| 2005/0024805 A1 | 2/2005 | Heilbronner et al. | |
| 2006/0274561 A1* | 12/2006 | Ahmed | H02M 7/003 363/132 |
| 2006/0290689 A1* | 12/2006 | Grant | H02M 7/003 345/204 |
| 2009/0085219 A1 | 4/2009 | Bayerer | |
| 2010/0065962 A1* | 3/2010 | Bayerer | H01L 23/3735 257/703 |
| 2012/0256194 A1* | 10/2012 | Yoshihara | H01L 24/32 257/77 |
| 2016/0079156 A1* | 3/2016 | Liu | H01L 23/5389 257/675 |

\* cited by examiner

POWER MODULE WITH LOW STRAY INDUCTANCE

FIELD OF THE INVENTION

The invention relates to the field of packaging of power semiconductors. In particular, the invention relates to a power module and to a power module and capacitor arrangement.

BACKGROUND OF THE INVENTION

In an electrical converter, the commutation loop stray inductance causes voltage overshoots during switching, produces EMI emissions by ringing, and increases the switching losses. Furthermore, experience with wide bandgap semiconductor power modules shows that the ringing in the power circuit may also produce high frequency noise in the gate circuit, thereby decreasing the controllability of the semiconductor switches and requiring a more sophisticated gate driver. The power module may be part of the commutation loop, therefore minimizing its stray inductance may be important.

Furthermore, power modules for fast switching semiconductors, especially for wide bandgap semiconductors, should have a low stray inductance (below 10 nH) to handle short current rise-times. On the other hand, a low current rating of typical wide bandgap semiconductors usually requires electrical paralleling of many semiconductor chips to reach practical current levels. Paralleling of semiconductor chips, however, requires more space for chip placement and signal routing and may therefore result in a higher stray inductance.

The stray inductance of a power module may be to a large part caused by the design of its power terminals. One reason may be the larger creepage and clearance distances required for external parts of the power terminals, where there may be no encasing (for example made of Si-Gel or epoxy). However, also with optimizing the internal structure of the power module, a lower stray inductance may be gained.

US 2005/0024805 A1 relates to a low inductance circuit arrangement for power semiconductor modules, in which a low-inductive power module assembly using terminal stripline and ribbon bonds is described.

DE 10 2014 102 018 B3 relates to a power module with a low stray inductance by a special arrangement of wire bonds.

U.S. Pat. No. 5,705,848 relating to a power semiconductor module describes a low-inductive and space-efficient way of interconnecting substrates using floating plates.

DESCRIPTION OF THE INVENTION

It is an objective of the invention to provide a power module with low stray inductance.

This objective is achieved by the subject-matter of the independent claims. Further exemplary embodiments are evident from the dependent claims and the following description.

An aspect of the invention relates to a power module providing a half bridge. A power module may be a device electrically and mechanically interconnecting a plurality of semiconductor switches. Usually, a power module comprises a substrate, which may have metallization layers on one or both sides to which the semiconductor switches are bonded. The substrate and the one or more metallization layers may be a DBC (direct bonded copper) substrate. Furthermore, the power module may comprise terminals, which also may be bonded to the metallization layers. The substrate, semiconductor switches and terminals may be cast into an encasing.

A half bridge may be an electrical circuit, comprising two switch elements, connected in series between two DC connection points and providing an AC connection point in between. The DC connection points and the AC connection point may be electrically connected to the terminals of the power module. Each switch element may be composed of one or more semiconductor switches electrically connected in parallel.

The power module may be employed in an electrical converter, which, for example, may rectify a DC voltage to be supplied to a DC link or a battery, such as a battery of an electric vehicle. It also may be possible that the inverter generates an AC voltage to be supplied to an electrical motor, such as the motor of an electric vehicle. The power module may be used in automotive applications, such as electric cars, motorbikes, busses, off-road construction vehicles, trucks and charging stations.

The power module may be adapted for processing currents of more than 10 A. The power module may be a low voltage module adapted for processing voltages below 1 kV or may be a medium voltage module adapted for processing voltages between 1 kV and 30 kV.

According to an embodiment of the invention, the power module comprises at least one substrate and an inner metallization area, two intermediate metallization areas and two outer metallization areas, each of which extends in a longitudinal direction of the substrate. The metallization areas may be arranged on one side of the one or more substrates and/or all may be provided by one metallization layer. It has to be understood that the metallization area may be disconnected from each other on the substrate, i.e. separated by grooves in the metallization layer. However, some of the metallization areas, like the two intermediate metallization areas and/or two outer metallization areas, may be electrically interconnected within the power module, for example via wire bonds.

The two intermediate metallization areas are arranged besides the inner metallization area with respect to a cross direction of the at least one substrate and each outer metallization area is arranged beside one of the two intermediate metallization areas with respect to the cross direction. In general, the power module may have a longitudinal direction, in which the inner, intermediate and outer metallization areas substantially extend, and a cross direction, in which these areas are arranged side by side. One outer metallization area, one intermediate metallization area, the inner metallization area, the other one intermediate metallization area and the other one outer metallization area may be arranged in this order in the cross direction.

Furthermore, the power module comprises two inner sets of semiconductor switches, each inner set of semiconductor switches bonded to one of the intermediate metallization areas and electrically connected to the inner metallization area, such that the inner sets of semiconductor switches form a first arm of the half bridge. The power module also comprises two outer sets of semiconductor switches, each outer set of semiconductor switches bonded to an outer metallization area and electrically connected to an intermediate metallization area, such that the outer sets of semiconductor switches form a second arm of the half bridge. The semiconductor switches from the inner sets and/or the outer sets may be connected via wire bonds with the inner metallization area and/or the corresponding intermediate metallization area. The semiconductor switches of each inner and outer set may be electrically connected in parallel with each other via the metallization areas and the further electrical connections (such as wire bonds). Furthermore, the inner sets may be connected in parallel with each and the outer sets may be connected in parallel by additional electrical interconnects, which interconnect the outer metallization areas with each other and/or the intermediate metallization area with each other.

Each of the semiconductor switches may be provided on a single chip and/or may be a wide bandgap switch, which, for example, may be based on SiC. The semiconductor switches may be IGBTs and/or MOSFETs.

In such a way, two nearly mirror symmetric semiconductor switch/metallization area arrangements are formed, which share the inner metallization area. This may result in a design with a lower number of electrical interconnections and may improve current balancing. It was shown by simulations that the corresponding approach results in a lower internal stray inductance of the power module compared to the above mentioned arrangements, in which identical (but not mirror symmetric) units are paralleled.

According to an embodiment of the invention, each inner set of semiconductor switches and/or each outer set of semiconductor switches are arranged in a row extending in the longitudinal direction. Thus, four rows of semiconductor switches may be provided on the substrate. Each row may have the same number of semiconductor switches and four semiconductor switches (each one of one row/set) may be aligned in the cross direction.

According to an embodiment of the invention, the power module comprises at least two substrates arranged side by side, following one the other in the longitudinal direction. The inner metallization area, the intermediate metallization areas and the outer metallization area may be distributed and/or may extend in the longitudinal direction over the at least two substrates. The part of the respective area on one substrate may be electrically connected with the other part on the next substrate via wire bonds.

According to an embodiment of the invention, the power module comprises at least two substrates arranged side by side, following one the other in the cross direction. The inner metallization area may be distributed in the cross direction over the at least two substrates. The part of the inner metallization area on one substrate may be electrically connected with the other part on the other substrate via wire bonds.

According to an embodiment of the invention, the arrangement of the two outer metallization areas, the two outer sets of semiconductor switches, the two intermediate metallization areas and the two inner sets of semiconductor switches is mirror symmetric to a symmetry axis of the inner metallization area. For example, the symmetry axis may be a middle axis of the substrate and/or the power module. As already mentioned, this may cause a highly balanced current and a low stray inductance.

According to an embodiment of the invention, on an AC side of the substrate, the intermediate metallization areas are electrically interconnected with an AC contact area extending in the cross direction. In general, the substrate and/or the power module may have an AC side, on which an AC terminal may be electrically connected and/or bonded to the substrate, and a DC side, on which DC terminals may be electrically connected and/or bonded to the substrate. The semiconductor switches may be arranged in between the AC side and the DC side (with respect to the longitudinal direction). On the AC side, the intermediate metallization areas are electrically interconnected with each other via an AC contact area extending in the cross direction, which also may be directly connected with an AC terminal.

According to an embodiment of the invention, the intermediate metallization areas and the AC contact area are a one-piece metallization area. However, it also may be possible that the AC contact area is separated from the intermediate metallization areas on the substrate and is electrically connected with the intermediate metallization areas with wire bonds.

On the DC side, at least one DC+ contact area for electrically connecting and/or bonding a DC+ terminal and a DC− contact area for electrically connecting and/or bonding a DC− terminal are provided, which may be extensions of the inner and/or outer metallization areas.

In general, the power module may comprise two DC contact areas provided by the two outer metallization areas and one DC contact area provided by the inner metallization area. The two outer contact areas may be DC+ or DC− contact areas. The inner contact areas may be a DC− or DC+ contact area.

According to an embodiment of the invention, on the DC side of the substrate and/or the power module, the inner metallization area provides an inner DC contact area, the inner DC contact area extending in the cross direction over the intermediate metallization areas, such that a T-shaped end of the inner metallization area is formed. In such a way, an inner DC terminal having a double current capacity with respect to two outer DC terminals may be connected to the substrate.

According to an embodiment of the invention, on the DC side of the substrate and/or the power module, each outer metallization area provides an outer DC contact area, the outer DC contact area extending in the cross direction over an intermediate metallization area, such that an L-shaped end of the outer metallization area is formed. This also may help for more easily providing a contact area for the DC terminal. It may be that the complete space on the DC side (except the space separating the metallization/contact areas) is covered by the inner and outer DC contact areas.

When the two outer metallization areas are not electrically interconnected, this may pose a risk of unwanted oscillations during switching events. The two outer metallization areas may be electrically connected on substrate level, for example by wire bonds. The outer metallization areas may be connected electrically inside the power module to improve the electrical balancing.

According to an embodiment of the invention, the outer DC contact areas are electrically interconnected on the DC side of the substrate with an electrical conductor extending over the inner metallization area. The outer DC contact areas may be directly interconnected via an electrical conductor, such as a cable or long wire bond.

When the semiconductor switches are controllable by external signals, gate control signals may be distributed to the semiconductor switches. The gate control signals may be distributed using wire bonds and additional metallization areas on the substrate.

According to an embodiment of the invention, between the inner metallization area and each intermediate metallization area, an inner gate contact area is provided on the substrate. The inner sets of semiconductor switches may be connected to the inner gate contact areas, for example via wire bonds. Both inner gate contact areas may be electrically connected with each other by an additional metallization area provided on the substrate, which may be one-piece with the substrate. According to an embodiment of the invention, an outer gate contact area is provided between each outer metallization area and a neighbouring intermediate metallization area. The outer sets of semiconductor switches may be connected to the outer gate contact areas, for example via wire bonds. The outer gate contact areas furthermore may be electrically interconnected with each other via wire bonds, for example via a bridging area provided besides the inner metallization area. This may ensure a uniform gate signal distribution on the other half of the half bridge.

Furthermore, the outer gate contact areas may be provided by one outer gate contact metallization area having a middle part extending in the cross direction. This middle part, for example, may be provided on the AC side besides the AC contact area, which interconnects the intermediated metallization areas.

In general, the gate contact areas may be arranged mirror symmetric to a symmetry axis of the power module. It has to be noted that gate signal distribution may be different for the inner sets and outer sets of semiconductor switches, each of which form a side/half of the half bridge.

According to an embodiment of the invention, the inner metallization area provides a DC− contact of the half bridge and the outer metallization areas provide a DC+ contact of the half bridge. This may result in an arrangement, wherein an inner DC− terminal is aligned with two DC+ terminals. In general, the inner DC terminal also may be the DC+ terminal.

According to an embodiment of the invention, the power module further comprises an inner DC terminal electrically connected to the inner metallization area and two outer DC terminals, each outer DC terminal electrically connected to an outer metallization area. This may result in a coaxial power terminal arrangement, comprising three power terminals aligned in one plane, wherein two outer terminals on the same potential are arranged besides an inner terminal on another potential.

According to an embodiment of the invention, the inner DC terminal and the two outer DC terminals extend in one plane and/or protruding in the longitudinal direction from the substrate.

According to an embodiment of the invention, the power module further comprises at least two inner DC terminals electrically connected to the inner metallization area. In other words, the inner DC terminal may be composed of two or more elements.

According to an embodiment of the invention, the power module further comprises at least two outer DC terminals electrically connected to one of the outer metallization areas. Also, each one of the outer DC terminals may be composed of two or more elements.

Due to the arrangement of inner, intermediate and outer metallization areas, the power module may be combined with the coaxial terminal arrangement, which may offer a significantly lower terminal stray inductance compared to existing terminal designs having having the plus terminals on one side and the minus terminal on the other side, without coaxial (or interleaved) arrangement. With the coaxial terminals, a low inductive power module connection to external bus bar systems may be provided.

The terminal arrangement may be beneficial for applications where the terminals have a considerable length, for example, when laminated bus bars may be not available (due to cost reasons), when laminated bus bars may be difficult to be used ( ) and/or when the terminals may be directly connected to capacitor terminals, such as, for example, in automotive applications.

The DC terminals may be realized by bonding a lead frame to the substrate, in particular to the DC contact areas.

According to an embodiment of the invention, a decoupling capacitor is mounted and electrically connected to the inner DC terminal and an outer DC terminal. The DC terminals may populated with one or more de-coupling capacitor, which may be a (for example small) capacitor directly mounted on the terminal conductors. For example, each outer DC terminal may be connected via a decoupling capacitor with the inner DC terminal.

A further aspect of the invention relates to a power module and capacitor arrangement comprising at least one power module as described in the above and in the following. For example, the arrangement may comprise two or more, in particular three, power modules, wherein each power module provides a leg of a multiphase inverter. Furthermore, the power modules may be mounted to a DC link capacitor element comprising capacitors of a DC link, electrically connected to the inverter.

According to an embodiment of the invention, the power module and capacitor arrangement comprises a DC link capacitor element providing a first DC terminal for each inner DC terminal and two second DC terminals for each outer DC terminal, wherein the two second DC terminals connected to the outer DC terminals of one power module are arranged besides the DC terminal connected to the inner DC terminal of the power module. I.e. the DC link capacitor element, which may comprise a plurality of capacitors in parallel, may provide DC terminals adapted for the one or power modules that may be mounted to a housing of the DC link capacitor element. Furthermore, the outer DC terminal of a power module may be electrically interconnected inside the DC link capacitor element, which second DC terminals may be connected to the same DC potential.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
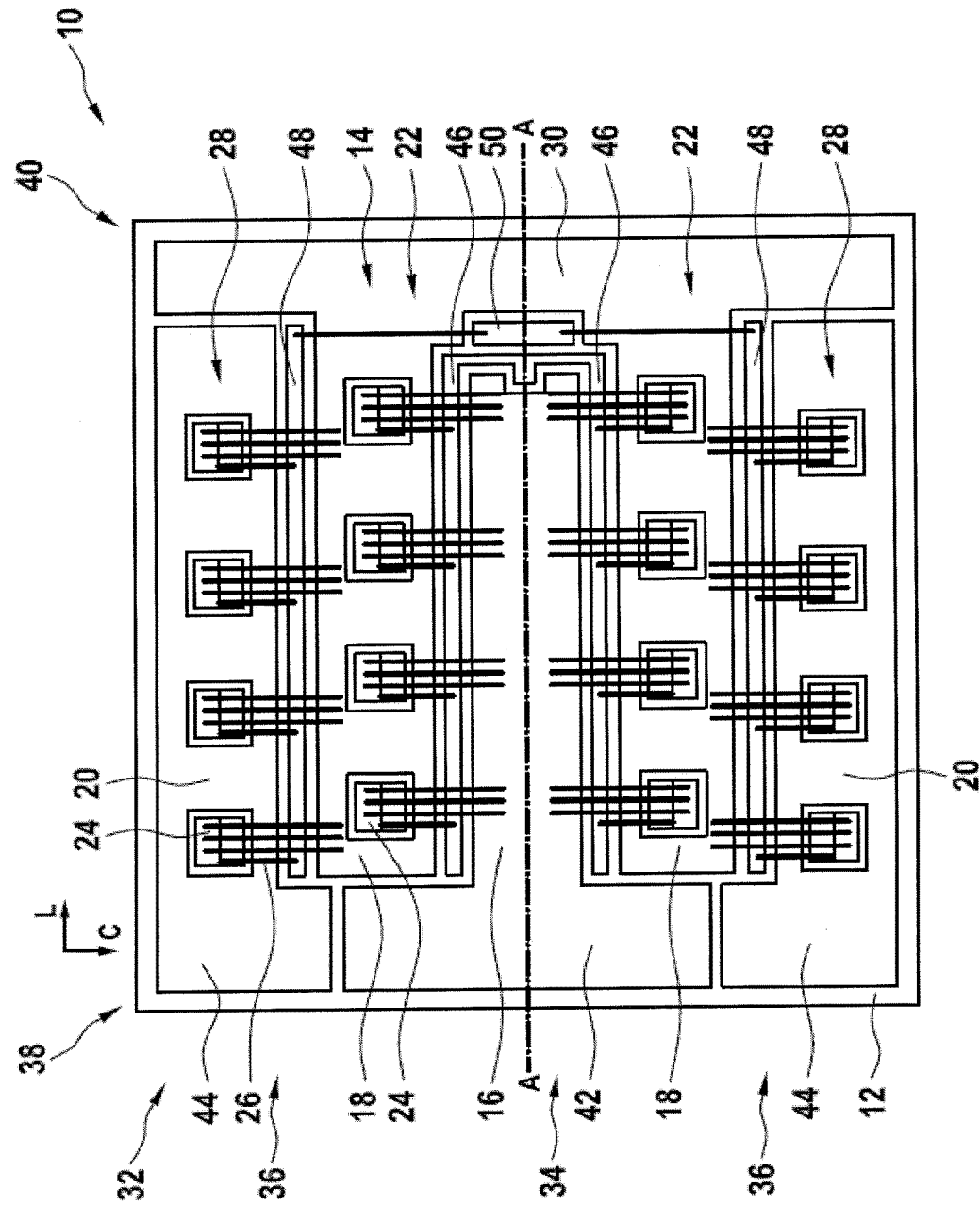
FIG. 1 schematically shows a top view of a power module according to an embodiment of the invention.

FIG. 1 shows a power module 10, which comprises a substrate 12 and a metallization layer 14 on one side. The metallization layer 14 is separated in different metallization areas, in particular, an inner metallization area 16, two intermediate metallization areas 18 and two outer metallization areas 20, which extend in a longitudinal direction L and are arranged side by side in a cross direction C. The metallization layer 14 comprises additional metallization areas, which will be described below.

On each of the two intermediate metallization areas 18, an inner set/row 22 of semiconductor switches 24 is arranged along the longitudinal direction. Each semiconductor switch 24 of each row 22 is bonded and/or electrically connected with one side to an intermediate metallization area 18 and is electrically connected with the other side to the inner metallization area 16 via wire bonds 26.

On each of the two outer metallization areas 18, an outer set/row 28 of semiconductor switches 24 is arranged along the longitudinal direction. Each semiconductor switch 24, which may be provided on a single chip, of each row 28 is bonded and/or electrically connected with one side to an outer metallization area 20 and is electrically connected with the other side to the intermediate metallization area 18, which is arranged on the same side of the inner metallization area 16 as the corresponding outer metallization area 20 via wire bonds 26.

The semiconductor switches 24, the metallization areas 16, 18, 20 and the wire bonds 26 form a half bridge 32. The semiconductor switches 24 of an inner row 22 are connected in parallel via the inner metallization area 16 and the corresponding intermediate metallization area 18. The semiconductor switches 24 of an outer row 28 are connected in parallel via the corresponding intermediate metallization area 18 and the corresponding outer metallization area 20.

Furthermore, the inner rows 22 are connected in parallel by an AC contact area 30, which electrically interconnects the intermediate metallization areas 18, and the single inner metallization area 16. The outer rows 28 are connected in parallel by the AC contact area 30 and a further electrical connection of the outer metallization area 20, which may be interconnected with each other within the power module 10 and/or outside of the power module 10. It has to be noted that the two outer metallization areas 20 may be disconnected from each other within the power module 10.

In summary, the inner rows 22 form a first arm 34 of the half bridge 32, interconnecting a first DC potential on the inner metallization area 16 with an AC potential on the intermediate metallization areas 18. The outer rows 28 form a second arm 36 of the half bridge 32.

In general, the power module 10 and/or the substrate may have a symmetry axis A, which may be the middle axis of the inner metallization area 16. The metallization areas 16, 18, 20 and the rows 22, 28 may be arranged mirror symmetric to the axis A. Also, the substrate 12 and/or the power module 10 may be (substantially) mirror symmetric with respect to the axis A.

It may be that the semiconductor switches 24 are bonded to the metallization areas 18, 20 in such a way, that the outer metallization areas 20 are on a DC+ potential, when the power module 10 is operating and that the inner metallization area 16 is on a DC− potential in this case. Then, along the cross direction C, a sequence of DC+, AC, DC−, AC, DC+ potentials appears.

The power module 10 has a DC side 38 and an AC side 40, for connecting respective terminals to the half bridge 32.

On the DC side 38, the inner metallization area 16 provides an inner DC contact area 42 to be connected with a DC terminal and the outer metallization areas 20 provide outer DC contact areas 44. With their DC contact areas 42, 44, the inner metallization area 16 is T-shaped and the outer metallization areas 20 are L-shaped. Also, the DC contact areas 42, 44 are mirror symmetric to the axis A.

On the AC side 40, the intermediate metallization areas 18 are one-piece with the AC contact area 30, which extends over the complete substrate 12 in the cross direction C.

The metallization layer 14 furthermore provides inner gate contact areas 46 and outer gate contact areas 48. The inner gate contact areas 46 extend between the inner metallization area 16 and an intermediate metallization area 18 and/or are electrically interconnected via bond wires 26 with the semiconductor switches 24 of the inner rows 22. The inner gate contact areas 46 may be electrically interconnected with each other with a metallization area on the substrate 12 and/or may be one-piece with this metallization area. The inner gate contact areas 46 together may be U-shaped.

The outer gate contact areas 48 extend between an intermediate metallization area 18 and an outer metallization area 20 and/or are electrically interconnected via bond wires 26 with the semiconductor switches 24 of the outer rows 28. The outer gate contact areas 48 may be interconnected via a bridging area 50, which is electrically connected via wire bonds 26 with each of the outer gate contact areas 48. The bridging area 50 may be provided directly besides the inner metallization area 16 and/or may only extends besides the inner metallization area 16.

Figure 2:
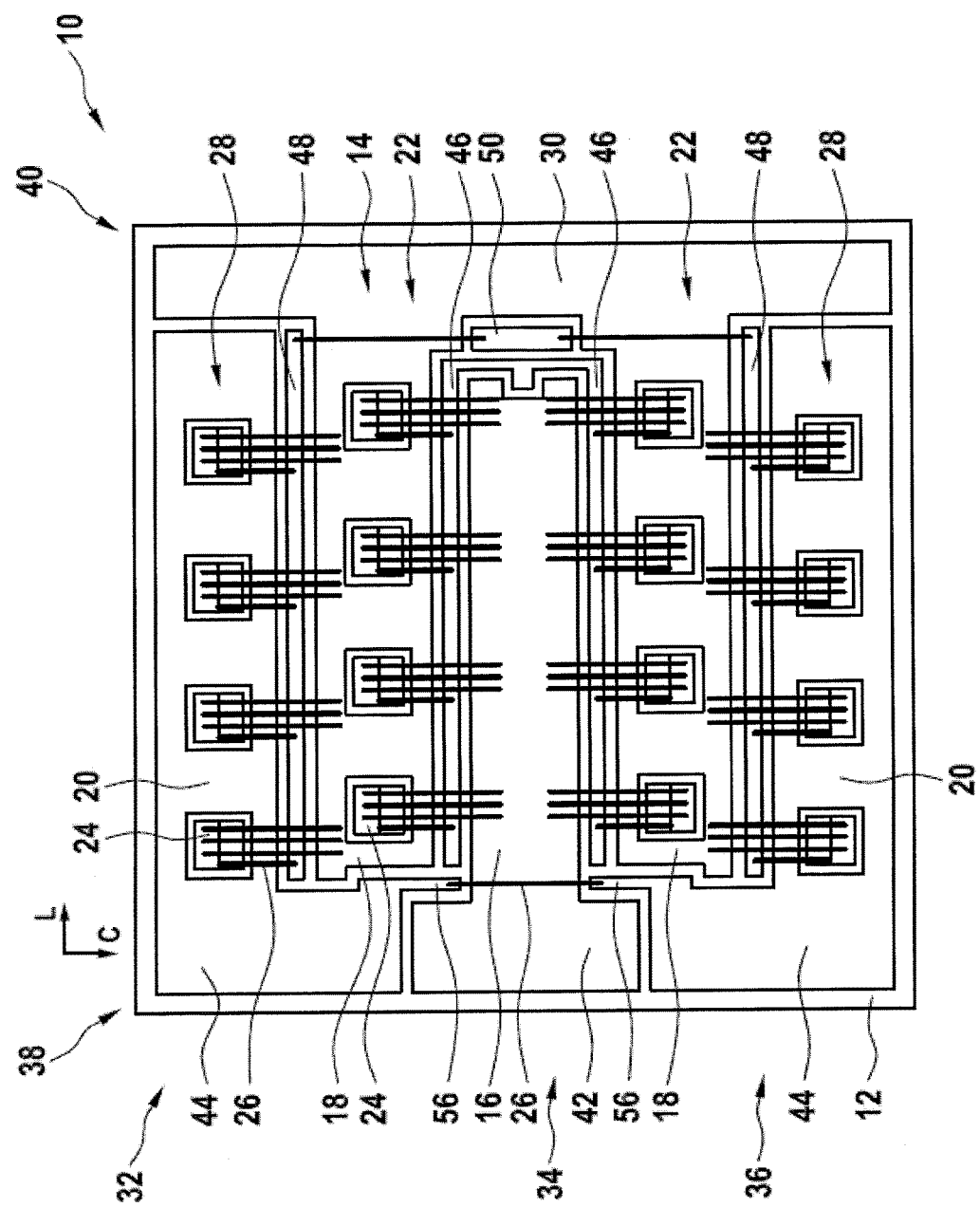
FIG. 2 schematically shows a top view of a power module according to a further embodiment of the invention.

In FIG. 2, which shows a further power module 10 with nearly the same design as the one from FIG. 1, the outer DC contact areas 44 are electrically connected with each other via a wire bond 26 extending over the inner metallization area 16. Each outer DC contact area 44 may have a protrusion 56 extending in the cross direction C up to the inner metallization area 16, which protrusion 56 is electrically connected with the wire bond 26 interconnecting the two outer DC contact areas 44.

Figure 3:
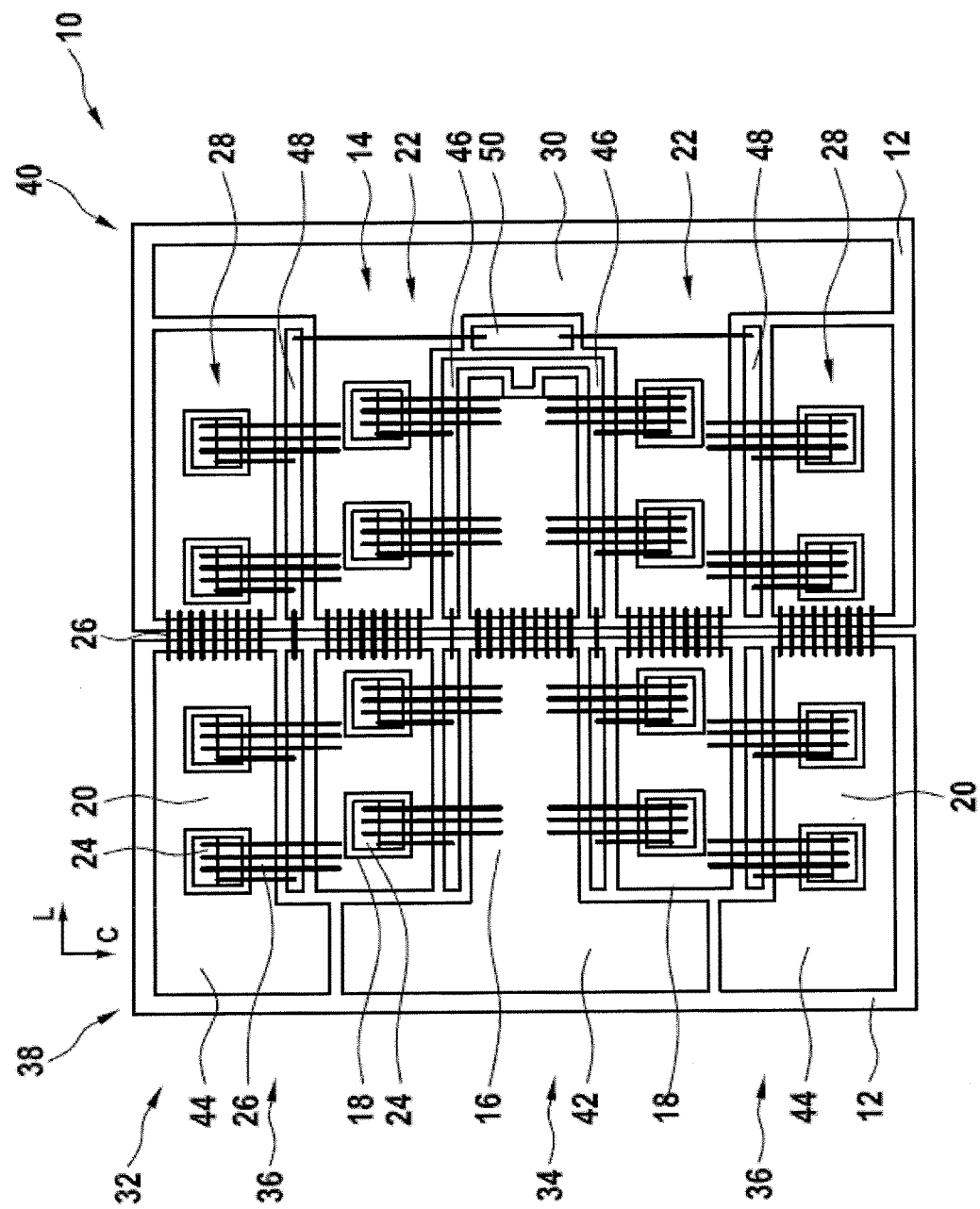
FIG. 3 schematically shows a top view of a power module according to a further embodiment of the invention.

FIG. 3 shows a power module 10 with two substrates 12, which carry the metallization layer 14 and the metallization areas. The two substrates 12 are arranged side by side along the longitudinal direction L, i.e. the DC side 38 and the AC side are provided on different substrates 12. The metallization areas 16, 18, 20 and 48 are distributed between the two substrates 12 and their respective parts are interconnected with wire bonds 26.

Figure 4:
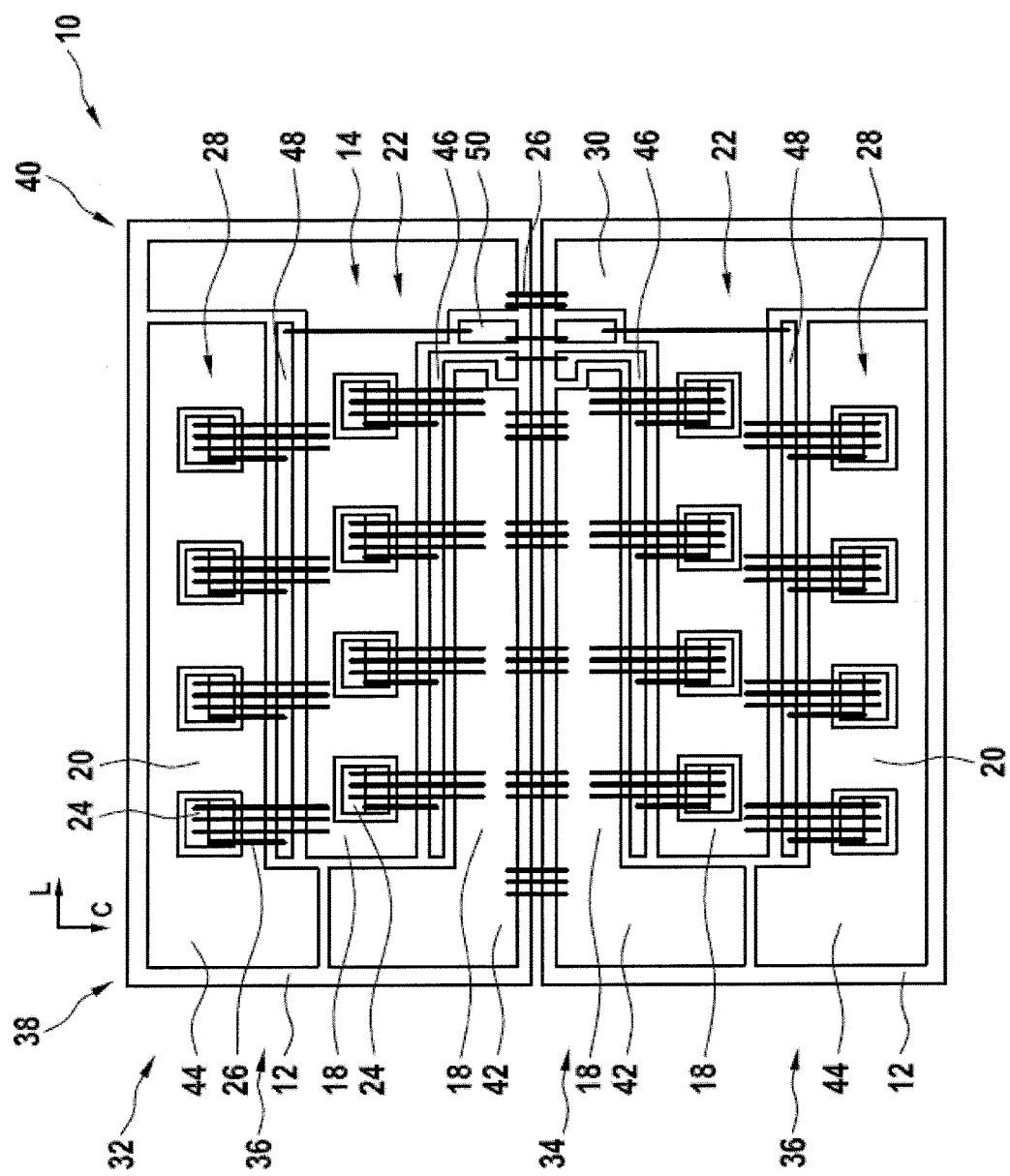
FIG. 4 schematically shows a top view of a power module according to a further embodiment of the invention.

FIG. 4 again shows a power module 10 with two substrates 12, which carry the metallization layer 14 and the metallization areas. However, the two substrates 12 are arranged side by side along the cross direction. In FIG. 4, the inner gate contact areas 46, the intermediate metallization areas 18, the outer gate contact areas 48 and the outer metallization areas 20 are provided on different substrates. The inner metallization area 16 (as well as the DC contact area 42) is provided in two parts on the different substrates 12. These two part are interconnected with wire bonds 26.

In all FIGS. 1 to 4, the stray inductance of the power module 10 is decreased by quasi-paralleling of the substantially identical but mirror symmetric parts of the power module 10 above and below the symmetry axis A. The two quasi-paralleled parts lower the total stray inductance $L_{\sigma,sub}$ of the arrangement according to $$L_\sigma = \frac{1}{\frac{1}{L_{\sigma,sub}} + \frac{1}{L_{\sigma,sub}}} = \frac{L_{\sigma,sub}}{2},$$

wherein $L_{o,sub}$ denotes the stray inductance of one part.

Figure 5:
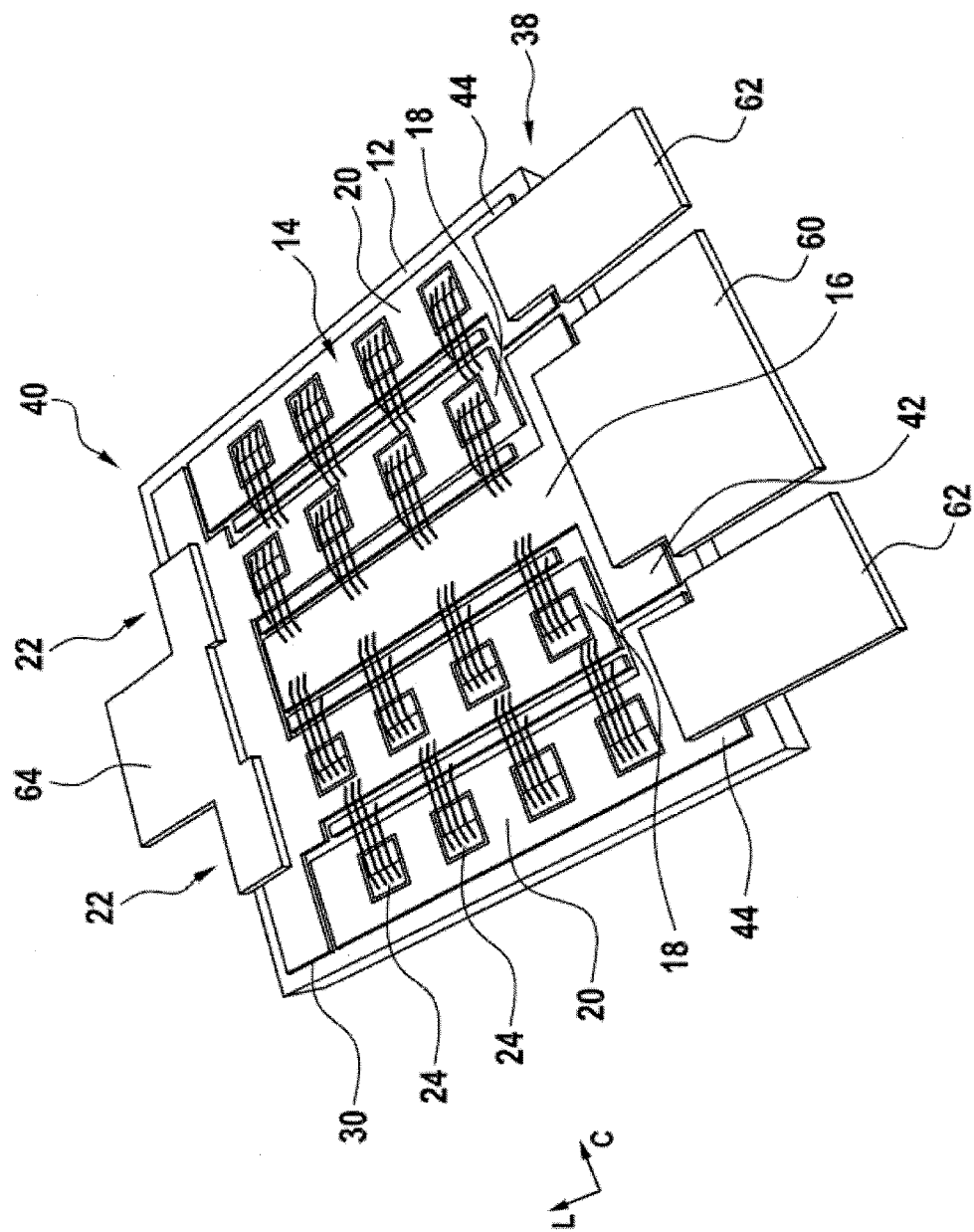
FIG. 5 schematically shows a perspective view of a power module according to a further embodiment of the invention.

The design of the substrate 12 and the metallization areas may be combined with a coaxial terminal structure as shown in FIG. 5. This coaxial terminal structure comprises three parallel DC terminals 60, 62, which are arranged in the same plane and/or which extend in the longitudinal direction L of the power module 10. In particular, an inner DC terminal 60 is electrically connected, for example bonded, to the inner DC contact area 42, and two outer DC terminals 62 are electrically connected, for example bonded, to the outer DC contact areas 44. The two outer DC terminals 62 may connect to the same DC potential (such as DC+), whereas the inner DC terminal 60 may connect to the opposite DC potential (such as DC−). The terminal structure and in particular the single inner DC terminal 60 may be imagined as parallel connection of two separate DC terminals. Also, the single inner metallization area 16 may be imagined as parallel connection of two separate metallization areas.

The DC power terminals 60, 62 are provided on the DC side 38. FIG. 5 furthermore shows that on the AC side 40, an AC power terminal 64 may be provided that is electrically connected, for example bonded, to the AC contact area 30. The AC terminal 64, like the DC terminals 60, 62 protrudes in the longitudinal direction L.

Figure 6:
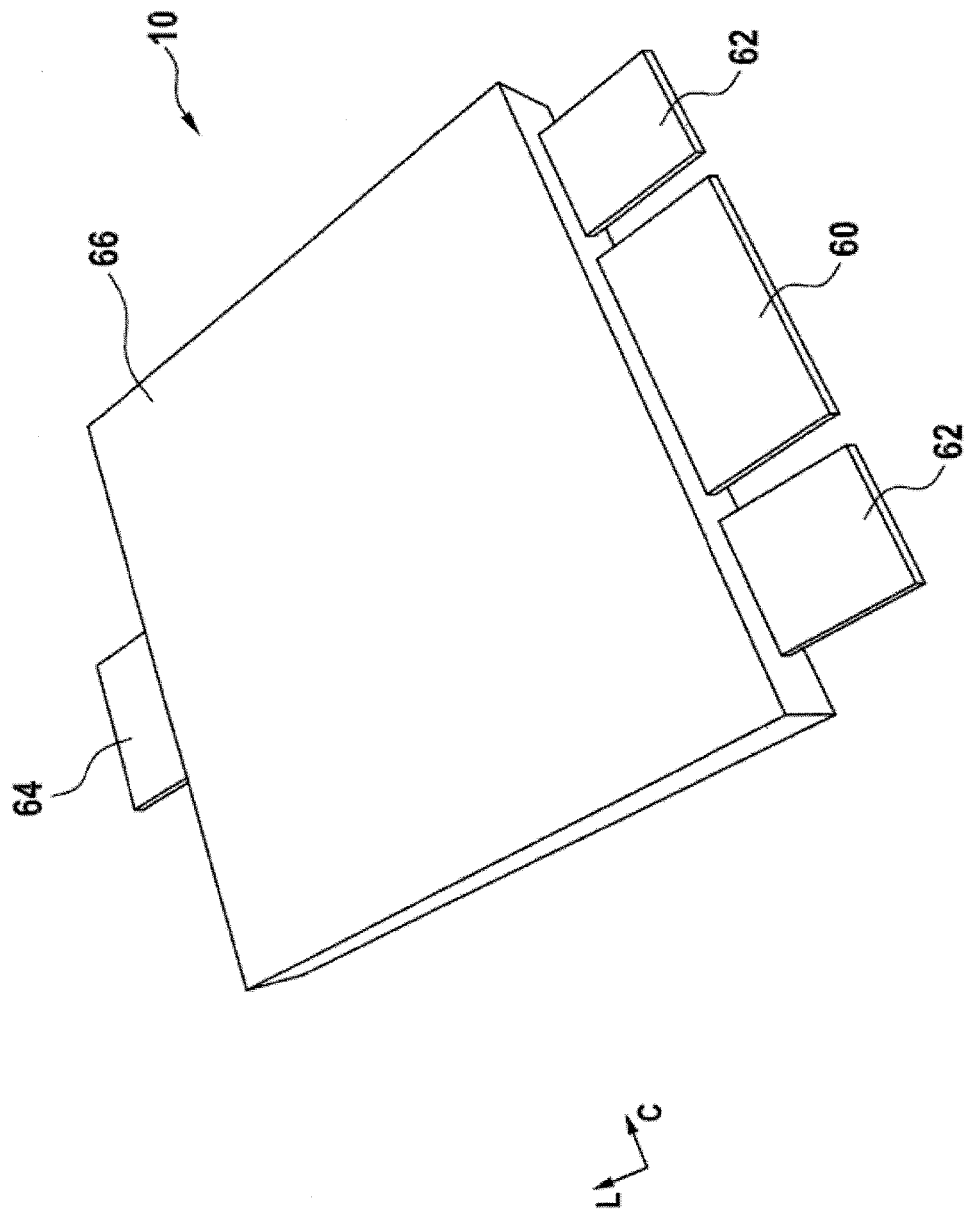
FIG. 6 schematically shows a perspective view of a power module according to a further embodiment of the invention.

FIG. 6 shows that the substrate 12, the metallization layer 14, the semiconductor switches 24, the wire bonds 26 and in particular all components of the power module 10 except the terminals 60, 62, 64 may be moulded into an encasing 66. Only the terminals 60, 62, 64 may protrude from the encasing 66, which, for example, may be made of epoxy.

Figure 7:
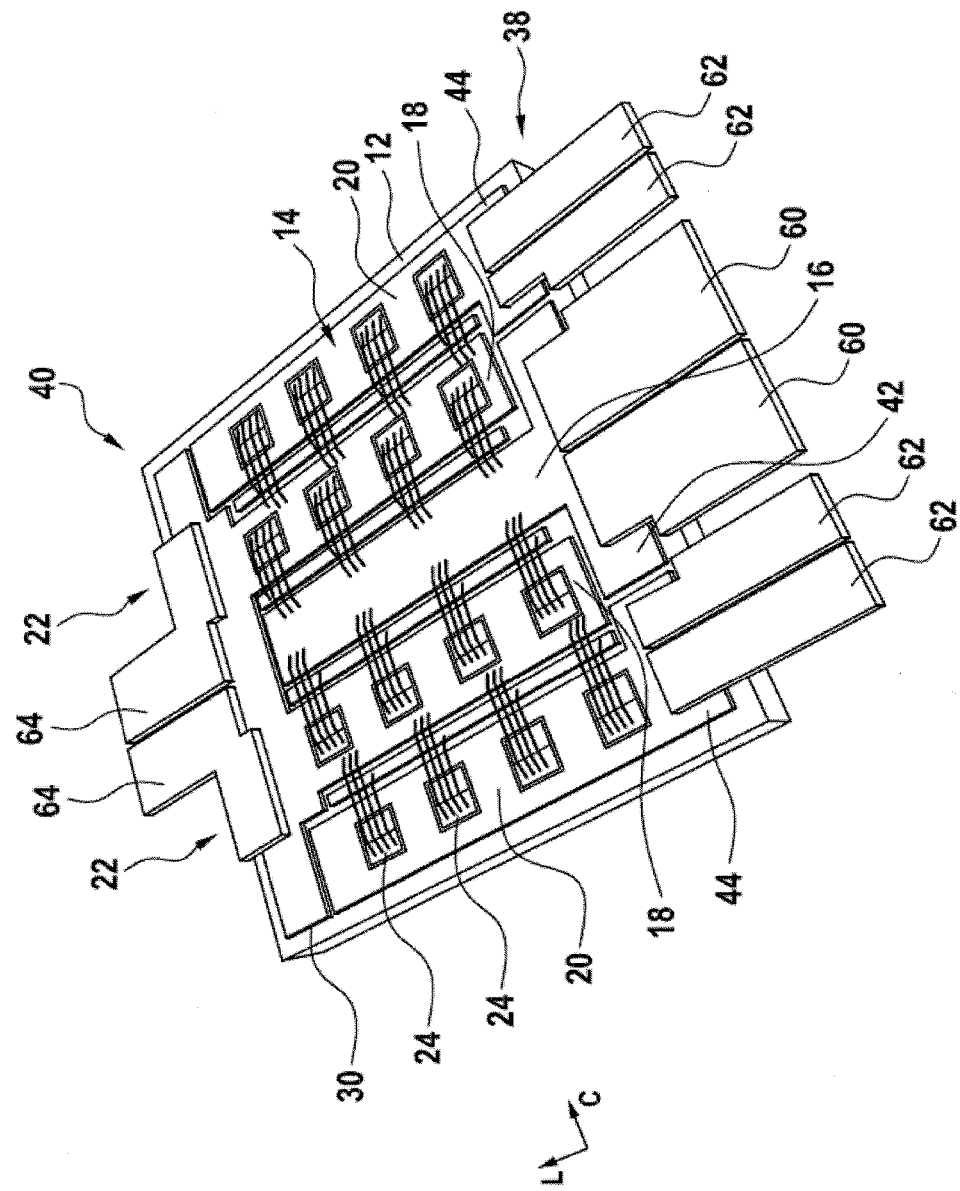
FIG. 7 schematically shows a perspective view of a power module according to a further embodiment of the invention.

FIG. 7 shows a power module similar to the one of FIG. 6, which however, has several terminals per contact area 42, 44, 30. In particular two inner DC terminals may be connected to the inner DC contact area 42. Furthermore, two outer DC terminals 62 may be connected to each of the outer DC contact areas 44 and/or two AC terminals 64 may be connected to the AC contact area 30. All terminals 60, 62, 64 may be arranged in the same plane and/or may extend in the longitudinal direction L of the power module 10.

Figure 8:
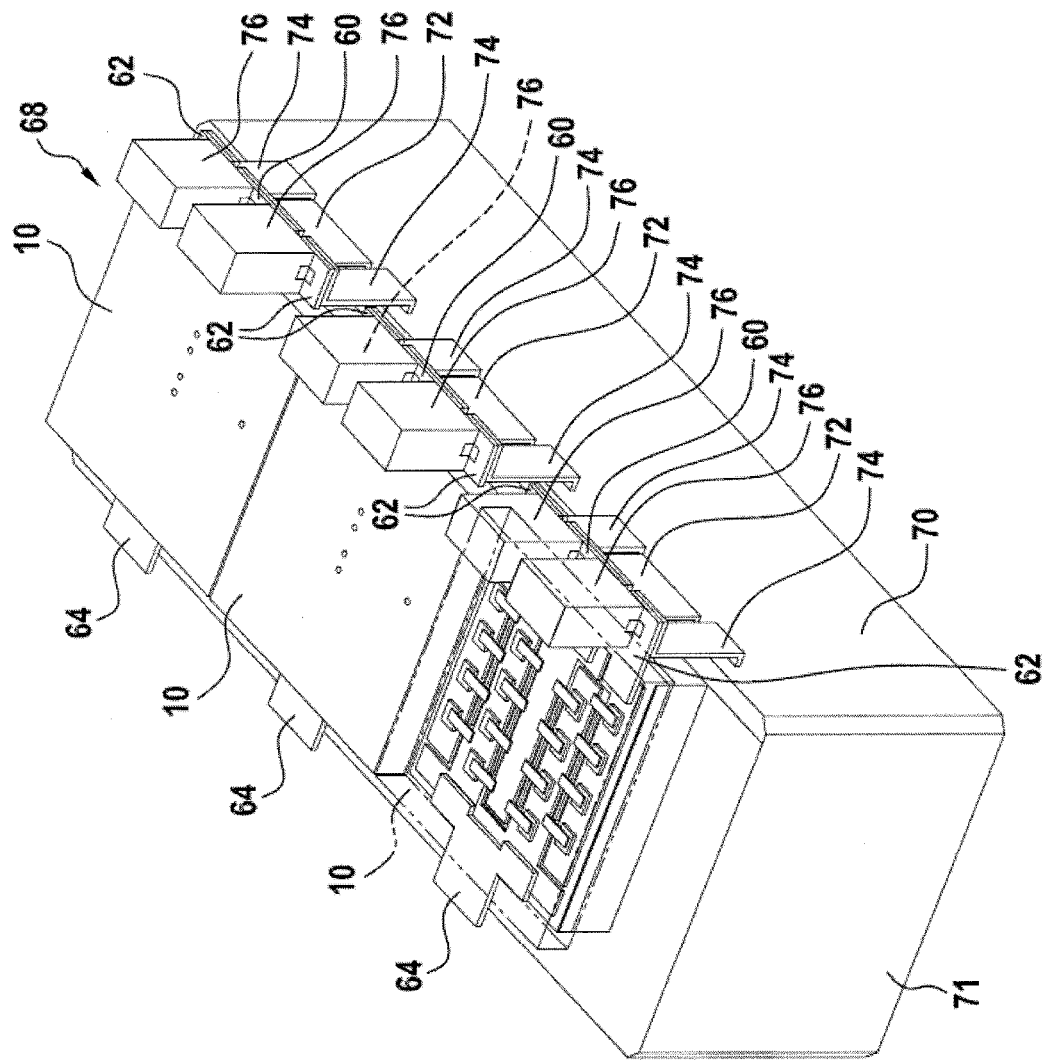
FIG. 8 schematically shows a perspective view of a power module and capacitor arrangement according to an embodiment of the invention.

FIG. 8 shows a power module and capacitor arrangement 68, which comprises three power modules arranged side by side on a capacitor element 70. For example, the three AC terminals 64 of the power modules 10 may be interconnected with a three-phase motor or generator, while the DC side of the three power modules 10 is connected with a DC link provided by the capacitor element 70.

The capacitor element 70 comprises a plurality of capacitors connected in parallel, which may be arranged inside a housing 71 to which the power modules 10 are mounted. For each power module 10, the capacitor element 70 provides a first DC terminal 72 and two second DC terminals 74. The second DC terminals 74 are arranged besides the first DC terminal 72 and/or are connected to the same DC potential (such as DC+) of the capacitor element 70.

Due to the coaxial terminal arrangement of the capacitor element 70 in combination with the power modules 10, also this arrangement has a rather low stray inductance.

On the DC terminals 60, 62, decoupling capacitors 76 may be mounted. In particular, a decoupling capacitor 76 may be mounted to an outer DC terminal 62 and the inner DC terminal 60 of a power module 10. A further decoupling capacitor 76 may be mounted to the other outer DC terminal 62 and the inner DC terminal 60.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power module
12 substrate
14 metallization layer
16 inner metallization area
18 intermediate metallization area
20 outer metallization area
22 inner set/row of semiconductor switches
24 semiconductor switch
26 wire bond
28 outer set/row of semiconductor switches
30 AC contact area
32 half bridge
34 first arm of half bridge
36 second arm of half bridge
38 DC side
40 AC side
42 inner DC contact area
44 outer DC contact area
46 inner gate contact area
48 outer gate contact area
50 bridging area
56 protrusion
60 inner DC terminal
62 outer DC terminal
64 AC terminal
66 encasing
68 power module and capacitor arrangement
70 capacitor element
71 housing
72 first terminal
74 second terminal
76 decoupling capacitor

The invention claimed is:

1. A power module providing a half bridge, wherein the power module comprises:
at least one substrate and an inner metallization area, two intermediate metallization areas and two outer metallization areas, each of which extends in a longitudinal direction (L) of the at least one substrate;
wherein the two intermediate metallization areas are arranged besides the inner metallization area with respect to a cross direction (C) of the at least one substrate and each outer metallization area is arranged beside one of the two intermediate metallization areas with respect to the cross direction (C);
wherein the power module comprises two inner sets of semiconductor switches, each inner set of semiconductor switches bonded to an intermediate metallization area and electrically connected to the inner metallization area, such that the inner sets of semiconductor switches form a first arm of the half bridge;

wherein the power module comprises two outer sets of semiconductor switches, each outer set of semiconductor switches bonded to an outer metallization area and electrically connected to an intermediate metallization area, such that the outer sets of semiconductor switches form a second arm of the half bridge.

2. The power module according to claim 1,
wherein each inner set of semiconductor switches and/or each outer set of semiconductor switches are arranged in a row extending in the longitudinal direction (L).

3. The power module according to claim 1,
wherein the power module comprises at least two substrates arranged side by side in the longitudinal direction (L) and wherein the inner metallization area, the intermediate metallization areas and the outer metallization areas are distributed in the longitudinal direction (L) over the at least two substrates.

4. The power module according to claim 1,
wherein the power module comprises at least two substrates arranged side by side in the cross direction (C) and wherein the inner metallization area, is distributed in the cross direction (C) over the at least two substrates.

5. The power module according to claim 1,
wherein the arrangement of the two outer metallization areas, the two outer sets of semiconductor switches, the two intermediate metallization areas and the two inner sets of semiconductor switches is mirror symmetric to a symmetry axis of the inner metallization area.

6. The power module according to claim 1,
wherein on an AC side of the substrate, the intermediate metallization areas are electrically interconnected with an AC contact area extending in the cross direction (C); and/or
wherein the intermediate metallization areas and the AC contact area are a one-piece metallization area.

7. The power module according to claim 1,
wherein on a DC side of the power module, the inner metallization area provides an inner DC contact area, the inner DC contact area extending in the cross direction (C) over the intermediate metallization areas, such that a T-shaped end of the inner metallization area is formed.

8. The power module according to claim 1,
wherein on a DC side of the power module, each outer metallization area provides an outer DC contact area, the outer DC contact area extending in the cross direction (C) over an intermediate metallization area, such that an L-shaped end of the outer metallization area is formed.

9. The power module according to claim 1,
wherein the outer DC contact areas are electrically interconnected on the DC side of the power module with an electrical conductor extending over the inner metallization area.

10. The power module according to claim 1,
wherein between the inner metallization area and each intermediate metallization area an inner gate contact area is provided on the substrate; and/or
wherein an outer gate contact area is provided between each outer metallization area and a neighbouring intermediate metallization area.

11. The power module according to claim 1,
wherein the inner metallization area provides a DC− contact of the half bridge and the outer metallization areas provide a DC+ contact of the half bridge.

12. The power module according to claim 1, further comprising:
an inner DC terminal electrically connected to the inner metallization area and two outer DC terminals, each outer DC terminal electrically connected to an outer metallization area.

13. The power module of claim 12,
wherein the inner DC terminal and the two outer DC terminals extend in one plane and/or protrude in the longitudinal direction (L) from the substrate; and/or
wherein a decoupling capacitor is mounted and electrically connected to the inner DC terminal and an outer DC terminal.

14. The power module of claim 12 further comprising,
at least two inner DC terminals electrically connected to the inner metallization area; and/or
at least two outer DC terminals electrically connected to one of the outer metallization areas.

15. A power module and capacitor arrangement, comprising:
at least one power module comprising:
at least one substrate and an inner metallization area, two intermediate metallization areas and two outer metallization areas, each of which extends in a longitudinal direction (L) of the at least one substrate;
wherein the two intermediate metallization areas are arranged besides the inner metallization area with respect to a cross direction (C) of the at least one substrate and each outer metallization area is arranged beside one of the two intermediate metallization areas with respect to the cross direction (C);
wherein the power module comprises two inner sets of semiconductor switches, each inner set of semiconductor switches bonded to an intermediate metallization area and electrically connected to the inner metallization area, such that the inner sets of semiconductor switches form a first arm of the half bridge;
wherein the power module comprises two outer sets of semiconductor switches, each outer set of semiconductor switches bonded to an outer metallization area and electrically connected to an intermediate metallization area, such that the outer sets of semiconductor switches form a second arm of the half bridge;
an inner DC terminal electrically connected to the inner metallization area and two outer DC terminals, each outer DC terminal electrically connected to an outer metallization area;
wherein the inner DC terminal and the two outer DC terminals extend in one plane and/or protrude in the longitudinal direction (L) from the substrate; and/or
wherein a decoupling capacitor is mounted and electrically connected to the inner DC terminal and an outer DC terminal; and
a DC link capacitor element providing a first DC terminal for each inner DC terminal and two second DC terminals for each outer DC terminal;
wherein the two second DC terminals connected to the outer DC terminals of one power module are arranged besides the one first DC terminal connected to the inner DC terminal of the power module.

16. The power module of claim 1,
wherein the inner DC terminal and the two outer DC terminals extend in one plane and/or protrude in the longitudinal direction (L) from the substrate;

wherein a decoupling capacitor is mounted and electrically connected to the inner DC terminal and an outer DC terminal;
at least two inner DC terminals electrically connected to the inner metallization area; and/or
at least two outer DC terminals electrically connected to one of the outer metallization areas.

17. The power module of claim 1,
wherein each inner set of semiconductor switches and/or each outer set of semiconductor switches are arranged in a row extending in the longitudinal direction (L); and
wherein the power module comprises at least two substrates arranged side by side in the longitudinal direction (L) and wherein the inner metallization area, the intermediate metallization areas and the outer metallization areas are distributed in the longitudinal direction (L) over the at least two substrates.

18. The power module of claim 1,
wherein each inner set of semiconductor switches and/or each outer set of semiconductor switches are arranged in a row extending in the longitudinal direction (L); and
wherein the power module comprises at least two substrates arranged side by side in the cross direction (C) and wherein the inner metallization area, is distributed in the cross direction (C) over the at least two substrates.

19. The power module of claim 1,
wherein the power module comprises at least two substrates arranged side by side in the longitudinal direction (L) and wherein the inner metallization area, the intermediate metallization areas and the outer metallization areas are distributed in the longitudinal direction (L) over the at least two substrates; and
wherein the power module comprises at least two substrates arranged side by side in the longitudinal direction (L) and wherein the inner metallization area, the intermediate metallization areas and the outer metallization areas are distributed in the longitudinal direction (L) over the at least two substrates.

20. The power module of claim 1,
wherein each inner set of semiconductor switches and/or each outer set of semiconductor switches are arranged in a row extending in the longitudinal direction (L); and
wherein the arrangement of the two outer metallization areas, the two outer sets of semiconductor switches, the two intermediate metallization areas and the two inner sets of semiconductor switches is mirror symmetric to a symmetry axis of the inner metallization area.

* * * * *